U S009181621B2

(12) United States Patent
Liu et al.

(10) Patent No.: US 9,181,621 B2
(45) Date of Patent: Nov. 10, 2015

(54) COATINGS FOR CUTTING TOOLS (71) Applicant: Kennametal Inc., Latrobe, PA (US)

(72) Inventors: Zhenyu Liu, Greensburg, PA (US); Peter Rudolf Leicht, Latrobe, PA (US); Rodrigo Alejandro Cooper, Latrobe, PA (US); Mark S. Greenfield, Greensburg, PA (US); Yixiong Liu, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 0 days.

(21) Appl. No.: 14/220,959

(22) Filed: Mar. 20, 2014

(65) Prior Publication Data

US 2014/0287199 A1    Sep. 25, 2014

Related U.S. Application Data (60) Provisional application No. 61/803,948, filed on Mar. 21, 2013.

(51) Int. Cl.
  *B23B 27/14*    (2006.01)
  *C23C 16/40*    (2006.01)
  *C23C 28/04*    (2006.01)
  *C23C 28/00*    (2006.01)

(52) U.S. Cl.
  CPC ............. *C23C 16/403* (2013.01); *C23C 28/042* (2013.01); *C23C 28/044* (2013.01); *C23C 28/048* (2013.01); *C23C 28/42* (2013.01); *Y10T 428/24802* (2015.01)

(58) Field of Classification Search
  USPC ............ 51/307, 309; 428/325, 697, 698, 699, 428/701, 702
  See application file for complete search history.

(56) References Cited

U.S. PATENT DOCUMENTS

| 4,052,530 | A | 10/1977 | Fonzi |
| 4,112,148 | A | 9/1978 | Fonzi |
| 4,180,400 | A | 12/1979 | Smith et al. |
| 4,576,836 | A | 3/1986 | Colmet et al. |
| 4,701,384 | A | 10/1987 | Sarin et al. |
| 4,702,970 | A | 10/1987 | Sarin et al. |
| 4,745,010 | A | 5/1988 | Sarin et al. |
| 4,746,563 | A | 5/1988 | Nakano et al. |

(Continued)

FOREIGN PATENT DOCUMENTS

| CN | 102581324 A | 7/2012 |
| DE | 2736982 A1 | 3/1979 |

(Continued)

OTHER PUBLICATIONS

X. Feng et al., "Converting Ceria Polyhedral Nanoparticles into Single-Crystal Nanospheres", Science Magazine, vol. 312, Jun. 9, 2006, pp. 1504-1508.

(Continued)

*Primary Examiner* — Archene Turner
(74) *Attorney, Agent, or Firm* — Matthew W. Gordon (57) ABSTRACT

In one aspect, cutting tools are described having coatings adhered thereto which, in some embodiments, can demonstrate desirable wear resistance and increased cutting lifetimes. A coated cutting tool, in some embodiments, comprises a substrate and a coating adhered to the substrate, the coating comprising a polycrystalline layer of $TiZrAl_2O_3$.

23 Claims, 6 Drawing Sheets

(56) References Cited

U.S. PATENT DOCUMENTS

| | | | |
|---|---|---|---|
| 4,749,629 A | 6/1988 | Sarin et al. | |
| 4,751,109 A | 6/1988 | Sarin et al. | |
| 4,844,951 A | 7/1989 | Sarin et al. | |
| 5,310,607 A | 5/1994 | Schulz et al. | |
| 5,447,804 A | 9/1995 | Schulz et al. | |
| 5,709,907 A | 1/1998 | Battaglia et al. | |
| 5,722,803 A | 3/1998 | Battaglia et al. | |
| 5,770,261 A | 6/1998 | Nakamura et al. | |
| 5,827,570 A | 10/1998 | Russell | |
| 5,861,210 A * | 1/1999 | Lenander et al. | 428/702 |
| 5,871,850 A | 2/1999 | Moriguchi et al. | |
| 5,879,823 A | 3/1999 | Prizzi et al. | |
| 5,972,495 A | 10/1999 | Ishii et al. | |
| 5,985,427 A | 11/1999 | Ueda et al. | |
| 6,156,383 A | 12/2000 | Ishii et al. | |
| 6,161,990 A | 12/2000 | Oles et al. | |
| 6,183,846 B1 | 2/2001 | Moriguchi et al. | |
| 6,333,103 B1 | 12/2001 | Ishii et al. | |
| 6,426,137 B1 | 7/2002 | Oshika et al. | |
| 6,436,519 B2 | 8/2002 | Holzschuh | |
| 6,599,062 B1 | 7/2003 | Oles et al. | |
| 6,641,939 B1 | 11/2003 | Lee et al. | |
| 6,660,371 B1 | 12/2003 | Westphal et al. | |
| 6,689,422 B1 | 2/2004 | Warnes et al. | |
| 6,713,172 B2 | 3/2004 | Ljungberg et al. | |
| 6,726,987 B2 | 4/2004 | Kathrein et al. | |
| 6,756,111 B1 | 6/2004 | Okada et al. | |
| 6,849,132 B2 | 2/2005 | Warnes et al. | |
| 6,869,668 B2 | 3/2005 | Martensson | |
| 6,902,764 B2 | 6/2005 | Ljungberg et al. | |
| 7,011,867 B2 | 3/2006 | Martensson | |
| 7,090,914 B2 | 8/2006 | Yamagata et al. | |
| 7,094,447 B2 | 8/2006 | Ruppi | |
| 7,163,735 B2 | 1/2007 | Ruppi | |
| 7,241,492 B2 | 7/2007 | Kohara et al. | |
| 7,273,665 B2 | 9/2007 | Hayahi et al. | |
| 7,276,301 B2 | 10/2007 | Tsushima et al. | |
| 7,326,461 B2 | 2/2008 | Sottke et al. | |
| 7,378,158 B2 | 5/2008 | Richter et al. | |
| 7,396,581 B2 | 7/2008 | Ruppi | |
| 7,410,707 B2 | 8/2008 | Fukui et al. | |
| 7,416,778 B2 | 8/2008 | Westergren et al. | |
| 7,442,433 B2 | 10/2008 | Honma et al. | |
| 7,498,089 B2 | 3/2009 | Omori et al. | |
| 7,531,212 B2 | 5/2009 | Kohara et al. | |
| 7,531,213 B2 | 5/2009 | Bjormander | |
| 7,597,511 B2 | 10/2009 | Tomita et al. | |
| 7,597,951 B2 | 10/2009 | Bjormander et al. | |
| 7,597,970 B2 | 10/2009 | Fukano et al. | |
| 7,691,496 B2 | 4/2010 | Park et al. | |
| 7,803,464 B2 | 9/2010 | Okada et al. | |
| 7,820,310 B2 | 10/2010 | Bjormander | |
| 7,901,788 B2 | 3/2011 | Warnes et al. | |
| 7,906,230 B2 | 3/2011 | Watanabe et al. | |
| 7,923,101 B2 | 4/2011 | Ruppi | |
| 7,928,028 B2 | 4/2011 | Nawa et al. | |
| 7,939,181 B2 | 5/2011 | Ramm et al. | |
| 7,967,533 B2 | 6/2011 | Omori et al. | |
| 7,968,182 B2 | 6/2011 | Trinh et al. | |
| 7,972,714 B2 | 7/2011 | Okada et al. | |
| 8,003,234 B2 * | 8/2011 | Omori et al. | 428/701 |
| 8,012,611 B2 | 9/2011 | Okada et al. | |
| 8,025,991 B2 | 9/2011 | Schier | |
| 8,071,211 B2 | 12/2011 | Koike et al. | |
| 8,080,312 B2 | 12/2011 | McNerny et al. | |
| 8,080,323 B2 * | 12/2011 | Ban et al. | 428/698 |
| 8,097,332 B2 | 1/2012 | Omori et al. | |
| 8,119,226 B2 | 2/2012 | Reineck et al. | |
| 8,119,227 B2 | 2/2012 | Reineck et al. | |
| 8,129,040 B2 | 3/2012 | Quinto et al. | |
| 8,152,971 B2 | 4/2012 | Quinto et al. | |
| 8,221,838 B2 | 7/2012 | Gates, Jr. et al. | |
| 8,288,019 B2 | 10/2012 | Nagano et al. | |
| 2001/0006724 A1 | 7/2001 | Holzschuh | |
| 2002/0081447 A1 | 6/2002 | Movchan et al. | |
| 2002/0114945 A1 | 8/2002 | Greenberg et al. | |
| 2002/0119017 A1 | 8/2002 | Gates, Jr. et al. | |
| 2004/0224159 A1 | 11/2004 | Oshika et al. | |
| 2004/0241490 A1 | 12/2004 | Finley | |
| 2005/0260454 A1 | 11/2005 | Fang et al. | |
| 2006/0029813 A1 | 2/2006 | Kutilek et al. | |
| 2006/0292390 A1 | 12/2006 | Kassner et al. | |
| 2007/0212895 A1 | 9/2007 | Chua et al. | |
| 2007/0289280 A1 | 12/2007 | Marquardt | |
| 2008/0196318 A1 | 8/2008 | Bost | |
| 2010/0166512 A1 | 7/2010 | Tanibuchi | |
| 2010/0303566 A1 | 12/2010 | Fang et al. | |
| 2012/0003452 A1 | 1/2012 | Tomita et al. | |

FOREIGN PATENT DOCUMENTS

| | | |
|---|---|---|
| EP | 0786536 B1 | 5/2003 |
| EP | 1655387 B1 | 5/2008 |
| JP | 56152962 A | 11/1981 |
| JP | 57158372 A | 9/1982 |
| JP | 5921586 A | 2/1984 |
| JP | 5985860 A | 5/1984 |
| JP | 0516031 A | 1/1993 |
| JP | 4195518 B2 | 7/1998 |
| JP | 4019244 B2 | 6/2002 |
| JP | 2003039207 A | 2/2003 |
| JP | 2005205516 A | 8/2005 |
| JP | 2006219739 A | 8/2006 |
| JP | 4645983 B2 | 10/2006 |
| JP | 2006289556 A | 10/2006 |
| JP | 2008019489 A | 1/2008 |
| JP | 2008019498 A | 1/2008 |
| JP | 4822120 B2 | 2/2008 |
| JP | 5019255 B2 | 1/2009 |
| JP | 5099490 B2 | 4/2009 |
| JP | 5099500 B2 | 7/2009 |
| JP | 2011057529 A | 3/2011 |
| JP | 2011127165 A | 6/2011 |
| JP | 2011184295 A | 9/2011 |
| JP | 2012143825 A | 8/2012 |
| KR | 1020060102658 A | 9/2006 |
| WO | 02/077312 A2 | 10/2002 |

OTHER PUBLICATIONS

Z. Yu et al., "Atomic-resolution observation of Hf-doped alumina grain boundaries", SciVerse ScienceDirect, Scripta Materialia 68 (2013) pp. 703-706.

N. Shibata et al., "Atomic-scale imaging of individual dopant atoms in a buried interface", Nature Materials, vol. 8, 2009, pp. 654-658.

J. P. Buban et al., "Grain Boundary Strengthening in Alumina by Rare Earth Impurities", Science Magazine, vol. 311, Jan. 13, 2006, pp. 212-215.

Z. Li et al., "Nanodomain formation and distribution in Gd-doped ceria", SciVerse ScienceDirect, Materials Research Bulletin 47 (2012) pp. 763-767.

C. Bjormander, "CVD deposition and characterization of coloured Al2O3/ZrO2 multilayers", ScienceDirect, Surface & Coatings Technology 201 (2006) pp. 4032-4036.

D. Hoachauer et al., "Titanium doped CVD alumina coatings", ScienceDirect, Surface & Coatings Technology 203 (2008) pp. 350-356.

W. C. Russell et al., "Wear Characteristics and Performance of Composite Alumina-Zirconia CVD Coatings", Int. J. of Refractory Metals & Hard Materials 14 (1996) pp. 51-58.

S. Taylor, "Grain Boundary Structure and Solute Segregation in Titanium-Doped Sapphire Bicrystals", Disseeration, University of California, Berkley, Spring 2002, pp. 1-222.

Jul. 4, 2014-PCT_Search_Report_&_Written_Opinion.

Kathrein et al., "Doped CVD Al2O3 Coatings for High Performance Cutting Tools", Surface & Coatings Technology 163-164 (2001), pp. 181-188.

Moltrecht, "Machine Shop Practice", Industrial Press Inc., New York, New York (1981), pp. 199-204.

ASTE Tool Engineers Handbook; McGraw Hill Book Co., New York, New York (1949), pp. 302-315.

(56) References Cited

OTHER PUBLICATIONS

International Search Report for PCT Application No. PCT/US2014/031358, mailed Jul. 7, 2014, 1 page.

International Search Report for PCT Application No. PCT/US2014/031291, mailed Jul. 4, 2014, 1 page.

* cited by examiner

COATINGS FOR CUTTING TOOLS

RELATED APPLICATION DATA

The present application claims priority pursuant to 35 U.S.C. §119(e) to U.S. Provisional Patent Application Ser. No. 61/803,948 filed Mar. 21, 2013, which is hereby incorporated by reference in its entirety.

FIELD

The present invention relates to coatings for cutting tools and, in particular, to coatings deposited by chemical vapor deposition (CVD).

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by CVD and by physical vapor deposition (PVD). While effective in inhibiting wear and extending tool lifetime in a variety of applications, refractory coatings based on single or multi-layer constructions of the foregoing refractory materials have increasingly reached their performance limits, thereby calling for the development of new coating architectures for cutting tools.

SUMMARY

In one aspect, cutting tools are described having coatings adhered thereto which, in some embodiments, can demonstrate desirable wear resistance and increased cutting lifetimes. A coated cutting tool described herein comprises a substrate and a coating adhered to the substrate, the coating comprising a polycrystalline layer of $TiZrAl_2O_3$. The polycrystalline layer of $TiZrAl_2O_3$ can be deposited by CVD. Further, the $TiZrAl_2O_3$ polycrystalline layer can demonstrate various intra-layer compositional gradients. For example, the polycrystalline layer of $TiZrAl_2O_3$ can have a compositional gradient including a stage composed of $Al_2O_3$ and stage composed of $TiZrAl_2O_3$. Alternatively, the polycrystalline layer of $TiZrAl_2O_3$ can have a compositional gradient including a stage composed of $Al_2O_3$, a stage composed of $ZrAl_2O_3$ and a stage composed of $TiAl_2O_3$. In a further embodiment, the polycrystalline layer of $TiZrAl_2O_3$ can have a compositional gradient including a stage composed of $Al_2O_3$, a stage composed of $ZrAl_2O_3$, a stage composed of $TiAl_2O_3$ and a stage composed of $TiZrAl_2O_3$.

Intra-layer compositional gradients are also reflected in grains of the $TiZrAl_2O_3$ polycrystalline layer. For example, an individual grain of the polycrystalline layer can display an intra-grain compositional gradient formed by presence of an $Al_2O_3$ stage and a $TiZrAl_2O_3$ stage within the grain. In another embodiment, an intra-grain compositional gradient is formed by the presence of an $Al_2O_3$ stage, $ZrAl_2O_3$ stage and $TiAl_2O_3$ stage within the grain. In a further embodiment, an intra-grain compositional gradient is formed by the presence of an $Al_2O_3$ stage, $ZrAl_2O_3$ stage, $TiAl_2O_3$ stage and $TiZrAl_2O_3$ stage within the grain.

Methods of making coated cutting tools are also provided. A method of making a coated cutting tool described herein comprises providing a cutting tool substrate and depositing over a surface of the cutting tool substrate by chemical vapor deposition a coating comprising a polycrystalline layer of $TiZrAl_2O_3$. The gas mixture employed by the CVD process can comprise $AlCl_3$, $ZrCl_4$, $TiCl_4$, $H_2$ and $CO_2$. Further, a polycrystalline $TiZrAl_2O_3$ layer deposited according to a method described herein can demonstrate an intra-layer compositional gradient described above. For example, the CVD deposited $TiZrAl_2O_3$ layer can have an intra-layer compositional gradient including a stage composed of $Al_2O_3$ and a stage composed of $TiZrAl_2O_3$. In another embodiment, the CVD deposited $TiZrAl_2O_3$ layer can display a compositional gradient including a stage composed of $Al_2O_3$, a stage composed of $ZrAl_2O_3$ and a stage composed of $TiAl_2O_3$. In a further embodiment, the CVD deposited $TiZrAl_2O_3$ layer can display a compositional gradient including a stage composed of $Al_2O_3$, a stage composed of $ZrAl_2O_3$, a stage composed of $TiAl_2O_3$ and a stage composed of $TiZrAl_2O_3$. As described further herein, intra-layer compositional gradients can be formed by the simultaneous and/or alternate introduction of $ZrCl_4$ and $TiCl_4$ into the CVD gas mixture These and other embodiments are described in greater detail in the detailed description which follows.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Coated Cutting Tools

In one aspect, cutting tools are described having coatings adhered thereto which, in some embodiments, can demonstrate desirable wear resistance and increased cutting lifetimes. A coated cutting tool described herein comprises a substrate and a coating adhered to the substrate, the coating comprising a polycrystalline layer of $TiZrAl_2O_3$.

Turning now to specific components, a coated cutting tool described herein comprises a substrate. Substrates of coated cutting tools can comprise any material not inconsistent with the objectives of the present invention. In some embodiments, a substrate comprises cemented carbide, carbide, ceramic, cermet or steel.

A cemented carbide substrate can comprise tungsten carbide (WC). WC can be present in a substrate in an amount of at least about 70 weight percent. In some embodiments, WC is present in a substrate in an amount of at least about 80 weight percent or in an amount of at least about 85 weight percent. Additionally, metallic binder of a cemented carbide substrate can comprise cobalt or cobalt alloy. Cobalt, for example, can be present in a cemented carbide substrate in an amount ranging from about 3 weight percent to about 15 weight percent. In some embodiments, cobalt is present in a cemented carbide substrate in an amount of 5-12 weight percent or 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC in the substrate. The substrate, in some embodiments, comprises one or more solid solution carbides in an amount ranging from about 0.1 weight percent to about 5 weight percent. Additionally, a cemented carbide substrate can comprise nitrogen.

A substrate, in other embodiments, comprises polycrystalline cubic boron nitride (PcBN). PcBN substrates can include any amount of PcBN not inconsistent with the objectives of the present invention. For example, PcBN substrates can comprise greater than 85 weight percent PcBN. In some embodiments, a cutting tool substrate described herein comprises PcBN in an amount selected from Table I.

TABLE I

| Weight Percent PcBN of Cutting Tool Substrate Substrate Wt. % PcBN |
| --- |
| ≥60 |
| ≥70 |
| >80 |
| >85 |
| ≥90 |
| 70-95 |
| 86-97 |
| 90-97 |
| 92-95 |

Further, PcBN substrates of cutting tools described herein can also comprise ceramic or metallic binder. Suitable ceramic binders for PcBN substrates can comprise nitrides, carbonitrides, carbides and/or borides of titanium, tungsten, cobalt or aluminum. In some embodiments, for example, a PcBN substrate comprises a binder of AlN, $AlB_2$ or mixtures thereof. Moreover, in some embodiments, a binder comprises solid solutions of any of the foregoing ceramic or metallic binders.

PcBN substrates having compositional parameters described herein can be provided in various constructions. For example, a coated cutting tool can comprise a stand-alone monolithic solid piece PcBN substrate. Alternatively, a PcBN substrate is provided as a compact or insert attached to a support by brazing or other joining technique. Further, a PcBN substrate can be a full top or full top/full bottom cutting insert on a support.

Figure 1:
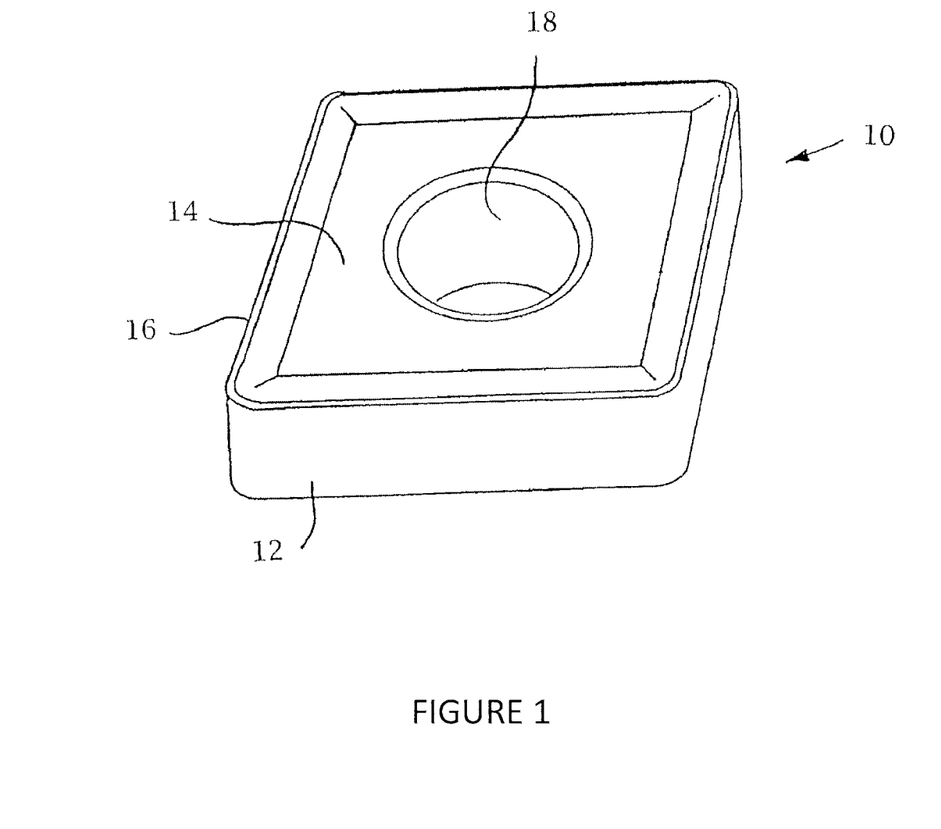
FIG. 1 illustrates a substrate of a coated cutting tool according to one embodiment described herein.

In some embodiments, a substrate of a coated cutting tool described herein comprises one or more cutting edges formed at the juncture of a rake face and flank faces of the substrate. FIG. 1 illustrates a substrate of a coated cutting tool according to one embodiment described herein. As illustrated in FIG. 1, the substrate (10) has cutting edges (12) formed at the junction of the substrate rake face (14) and flank faces (16). The substrate also comprises an aperture (18) operable to secure the substrate (10) to a tool holder.

In some embodiments, a substrate of a coated cutting tool is an insert, drill bit, saw blade or other cutting apparatus.

A coating adhered to the substrate comprises a polycrystalline layer of $TiZrAl_2O_3$. Titanium and zirconium, for example, can be dopants in the polycrystalline structure. Titanium and zirconium can be present in the polycrystalline layer in any amount not inconsistent with the objectives of the present invention. In some embodiments, titanium and zirconium are present in the polycrystalline $TiZrAl_2O_3$ layer in amounts selected from Tables II and III.

TABLE II

| Ti of Polycrystalline $TiZrAl_2O_3$ Layer Ti Content (wt. %) |
| --- |
| 0.01-5 |
| 0.1-4 |
| 0.15-3 |
| 0.2-2 |

TABLE III

| Zr of Polycrystalline $TiZrAl_2O_3$ Layer Zr Content (wt. %) |
| --- |
| 0.01-5 |
| 0.1-4 |
| 0.15-3 |
| 0.2-2 |

In being dopants, titanium and/or zirconium can be incorporated into the lattice of an $Al_2O_3$ phase. In such embodiments, the titanium and/or zirconium do not form oxide phase(s) separate from the $Al_2O_3$ phase.

Titanium and zirconium can be generally dispersed throughout the polycrystalline layer of $TiZrAl_2O_3$. Alternatively, a polycrystalline layer of $TiZrAl_2O_3$ can demonstrate various compositional gradients described herein. For example, the $TiZrAl_2O_3$ polycrystalline layer can display a compositional gradient including a stage composed of $Al_2O_3$ and a stage composed of $TiZrAl_2O_3$. This intra-layer compositional gradient can be established by a singular occurrence of the $Al_2O_3$ stage and the $TiZrAl_2O_3$ stage within the layer. In other embodiments, the intra-layer compositional gradient is established by multiple occurrences of the $Al_2O_3$ stage and the $TiZrAl_2O_3$ stage within the layer. In such embodiments, $Al_2O_3$ stages can alternate with $TiZrAl_2O_3$ stages throughout the polycrystalline layer.

An intra-layer gradient comprising an $Al_2O_3$ stage and a $TiZrAl_2O_3$ stage can be reflected in grains of the $TiZrAl_2O_3$ layer. For example, an individual grain of the polycrystalline layer can display an intra-grain compositional gradient formed by presence of the $Al_2O_3$ stage and the $TiZrAl_2O_3$ stage within the grain. In some embodiments, the $Al_2O_3$ stage and the $TiZrAl_2O_3$ stage alternate throughout individual grains.

Figure 2:
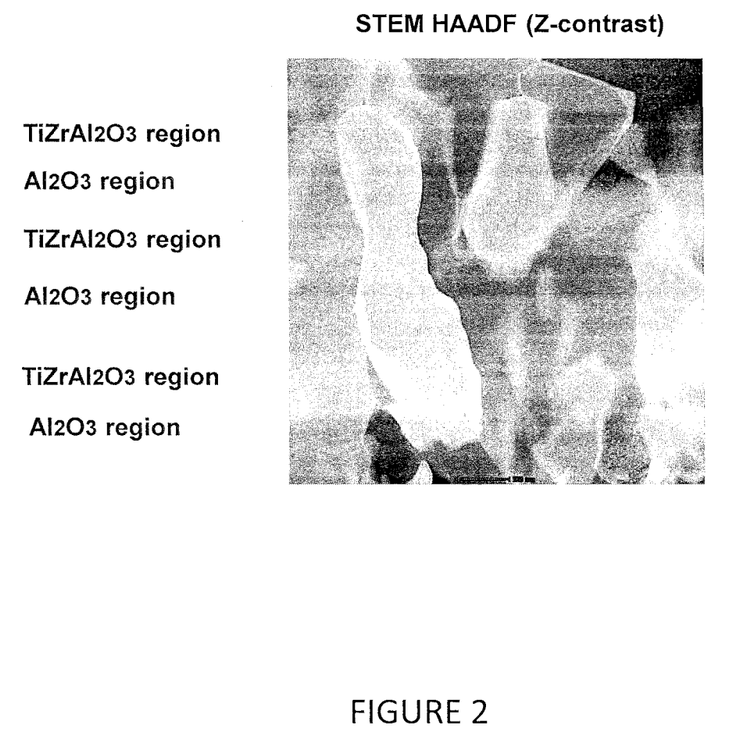
FIG. 2 is a scanning transmission electron microscopy/high angular annular dark field (STEM-HAADF) image of grains of a CVD polycrystalline $TiZrAl_2O_3$ layer according to one embodiment described herein.
Figure 3:
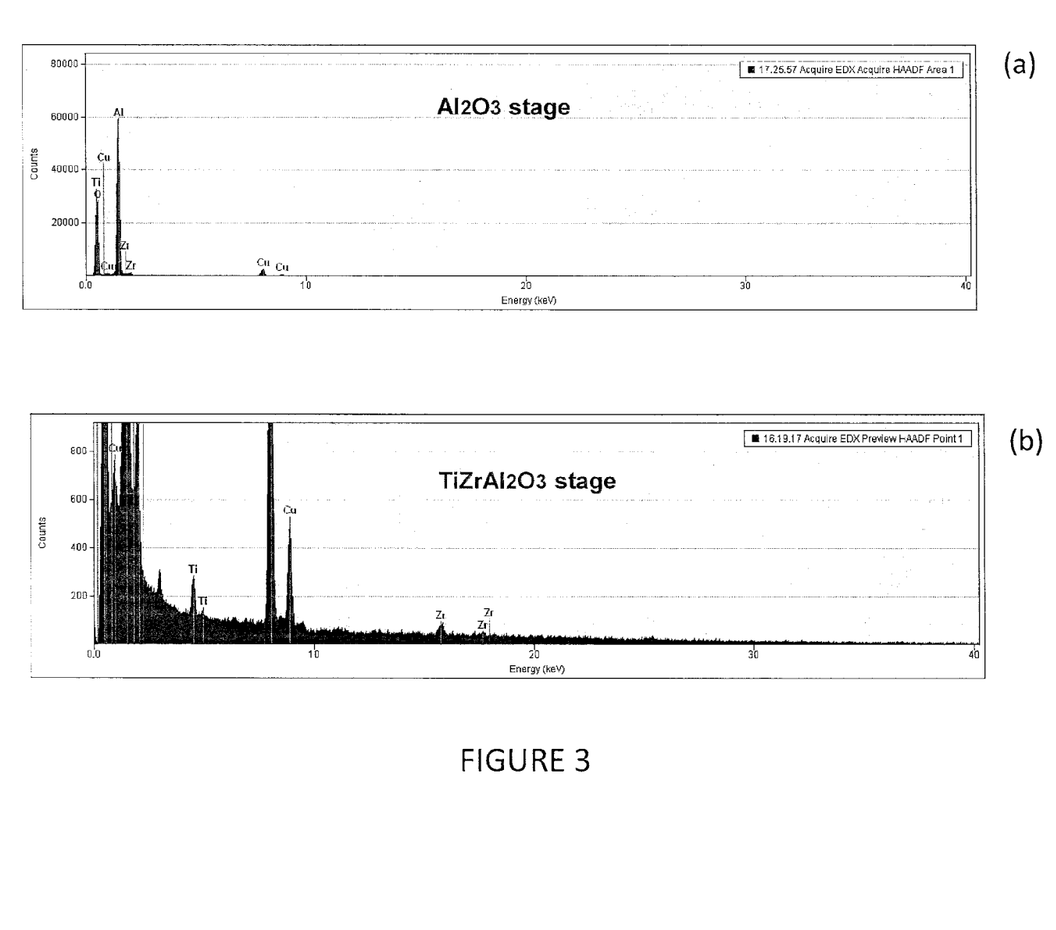
FIG. 3 is an energy dispersive spectroscopy (EDS) spectrum demonstrating a compositional gradient within individual grains of a CVD polycrystalline $TiZrAl_2O_3$ layer according to one embodiment described herein.

FIG. 2 is a STEM-HAADF image of grains of a CVD polycrystalline $TiZrAl_2O_3$ layer according to one embodiment described herein. As illustrated in FIG. 2, grains of the $TiZrAl_2O_3$ layer display regions of $TiZrAl_2O_3$ alternating with regions of $Al_2O_3$. The alternating regions in FIG. 2 follow the growth direction of the grains forming a striped structure attributed to contrast provided by the presence of Ti and Zr. The corresponding STEM EDS spectrum of FIG. 3 further demonstrates intra-grain compositional gradients formed by regions including Ti and Zr [FIG. 3(b)] and regions wherein Ti and Zr are absent [FIG. 3(a)].

Figure 4:
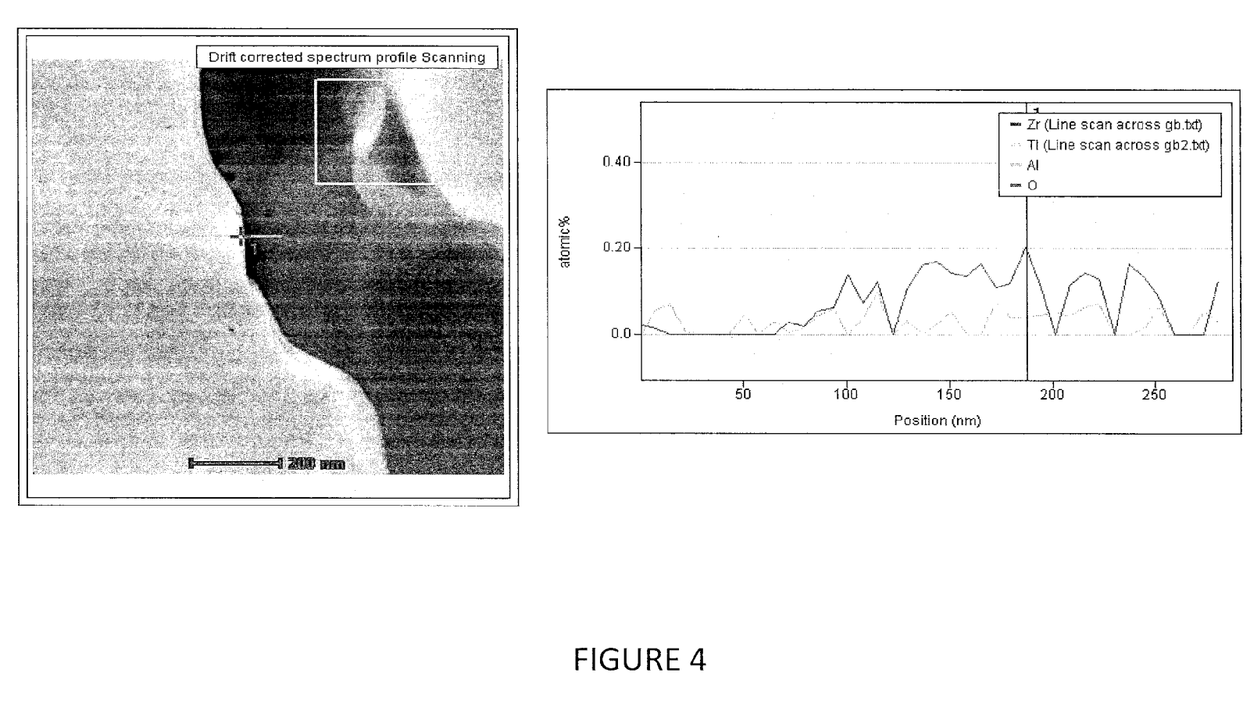
FIG. 4 is an EDS line profile produced in conjunction with STEM analysis of a grain according to one embodiment described herein.

Further, a $TiZrAl_2O_3$ stage of the polycrystalline layer can also display a compositional gradient formed by localization of titanium or zirconium in one or more regions of the stage. Zr, for example, can localize in regions adjacent to grain boundaries, thereby establishing a gradient with Ti within a $TiZrAl_2O_3$ stage. FIG. 4 is an STEM EDS line profile of the pictured $TiZrAl_2O_3$ grain according to one embodiment described herein. As illustrated in FIG. 4, Zr localizes in the vicinity of the grain boundary whereas Ti remains relatively uniformly distributed.

Figure 5:
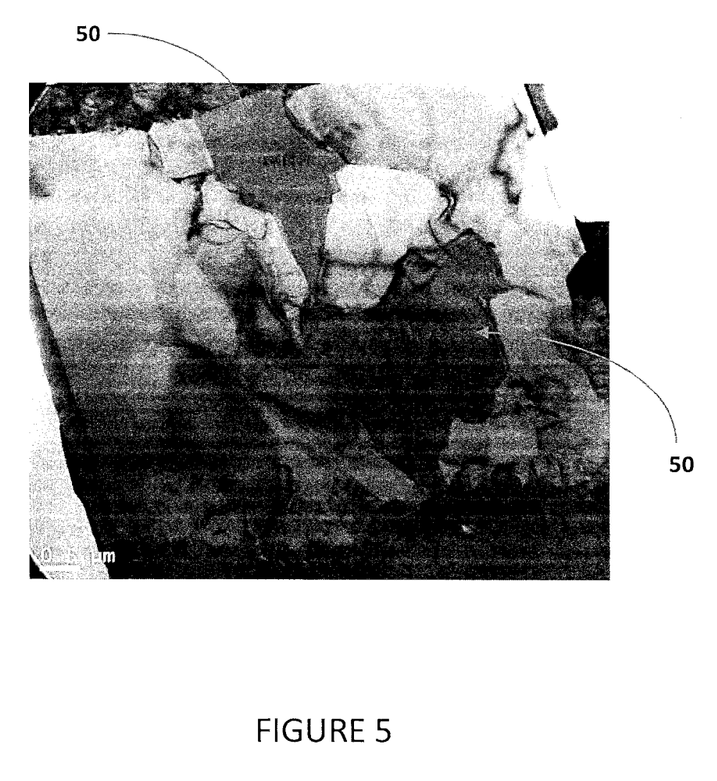
FIG. 5 is a TEM bright field image of grains in a $TiZrAl_2O_3$ layer, wherein a $TiZrAl_2O_3$ grain having an irregular shape is illustrated.

Grains of the polycrystalline $TiZrAl_2O_3$ layer can additionally display unique geometries not found in other CVD coatings, including alumina coatings. Grains of the polycrystalline $TiZrAl_2O_3$ layer, for example, can have irregular geometries in the lateral and/or vertical dimension(s). FIG. 5 is a TEM bright field image of grains in a $TiZrAl_2O_3$ layer, wherein a $TiZrAl_2O_3$ grain (50) having an irregular shape is illustrated. The irregular grain (50) of FIG. 5 displays two regions connected by a thinner conical region. Irregular shapes presented by $TiZrAl_2O_3$ grains are in contrast to prior CVD coatings, including alumina coatings, demonstrating regular columnar or equiaxed geometries.

As described herein, a polycrystalline $TiZrAl_2O_3$ layer can display other intra-layer compositional gradient arrangements. In some embodiments, an intra-layer compositional gradient comprises a stage composed of $Al_2O_3$, a stage composed of $ZrAl_2O_3$ and a stage composed of $TiAl_2O_3$. Such an intra-layer compositional gradient can be reflected in individual grains of the polycrystalline $TiZrAl_2O_3$ layer. For example, an individual grain can comprise an intra-grain compositional gradient formed by the presence of the $Al_2O_3$ stage, the $ZrAl_2O_3$ stage and the $TiAl_2O_3$ stage. Further, an intra-layer compositional gradient can comprise a stage composed of $Al_2O_3$, a stage composed of $ZrAl_2O_3$, a stage composed of $TiAl_2O_3$ and a stage composed of $TiZrAl_2O_3$. This intra-layer compositional gradient can also be reflected in individual grains of the polycrystalline $TiZrAl_2O_3$ layer.

A polycrystalline $TiZrAl_2O_3$ layer can have any thickness not inconsistent with the objectives of the present invention. In some embodiments, a polycrystalline $TiZrAl_2O_3$ layer has a thickness of 1-15 μm or 2-10 μm.

Moreover, a polycrystalline $TiZrAl_2O_3$ layer can be deposited directly on a surface of the cutting tool substrate without use of bonding and/or modification layers. However, in some embodiments, one or more base layers of the coating reside between the substrate and the polycrystalline $TiZrAl_2O_3$ layer. A base layer can comprise one or more metallic elements selected from the group consisting of aluminum and metallic elements of Groups IVB, VB and VIB of the Periodic Table and one or more non-metallic elements of Groups IIIA, IVA, VA and VIA of the Periodic Table. A base layer, for example, can be selected from the group consisting of titanium nitride (TiN), titanium carbonitride (TiCN) and titanium oxycarbonitride (TiOCN). In some embodiments, a multilayer arrangement is present comprising TiN, TiCN and/or TiOCN. A base layer can have any thickness not inconsistent with the objectives of the present invention. In some embodiments, a base layer has a thickness of 0.2-12 μm or 0.5-5 μm.

Additionally, a coating described herein can further comprise one or more outer layers over the polycrystalline $TiZrAl_2O_3$ layer. An outer layer, in some embodiments, comprises one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In some embodiments, one or more outer layers over the $TiZrAl_2O_3$ layer comprise a nitride, carbonitride, oxide or boride of one or more metallic elements selected from the group consisting of aluminum and metallic elements of Groups IVB, VB and VIB of the Periodic Table. For example, one or more outer layers are selected from the group consisting of titanium nitride, titanium carbonitride, titanium carbide, zirconium nitride, zirconium carbonitride, hafnium nitride, hafnium carbonitride and alumina and mixtures thereof. Outer layers of coatings described herein can have any thickness not inconsistent with the objectives of the present invention. An outer layer of a coating, in some embodiments, can have a thickness ranging from 0.5 μm to 5 μm.

In some embodiments, a CVD coating described herein can have an architecture selected from Table IV. Coating architectures provided in Table IV begin with the innermost layer adjacent to the substrate and continue to the outermost layer. Additionally, $TiZrAl_2O_3$ layers of the coating architectures listed in Table IV can demonstrate any of the compositional gradients described in this Section I.

TABLE IV

Coating Architectures
CVD Coating Structure $TiN-TiZrAl_2O_3$
$TiN-TiZrAl_2O_3-TiN$
$TiN-TiZrAl_2O_3-TiN/TiCN$
$TiN-TiCN(MT)*-TiZrAl_2O_3$
$TiN-TiCN(MT)-TiZrAl_2O_3-TiN$
$TiN-TiCN(MT)-TiZrAl_2O_3-TiN/TiCN$
$TiN-TiCN(HT)**-TiZrAl_2O_3$
$TiN-TiCN(HT)-TiZrAl_2O_3-TiN$
$TiN-TiCN(HT)-TiZrAl_2O_3-TiN/TiCN$
$TiN-TiCN(MT)-TiCN(HT)-TiZrAl_2O_3$
$TiN-TiCN(MT)-TiCN(HT)-TiZrAl_2O_3-TiN$
$TiN-TiCN(MT)-TiCN(HT)-TiZrAl_2O_3-TiN/TiCN$
$TiN-TiCN(MT)-TiCN(HT)/TiOCN-TiZrAl_2O_3$
$TiN-TiCN(MT)-TiCN(HT)/TiOCN-TiZrAl_2O_3-TiN$
$TiN-TiCN(MT)-TiCN(HT)/TiOCN-TiZrAl_2O_3-TiN/TiCN$
$TiCN(MT)-TiZrAl_2O_3$
$TiCN(MT)-TiZrAl_2O_3-TiN$
$TiCN(MT)-TiZrAl_2O_3-TiN/TiCN$
$TiCN(HT)-TiZrAl_2O_3$
$TiCN(HT)-TiZrAl_2O_3-TiN$
$TiCN(HT)-TiZrAl_2O_3-TiN/TiCN$
$TiCN(MT)-TiCN(HT)-TiZrAl_2O_3$
$TiCN(MT)-TiCN(HT)-TiZrAl_2O_3-TiN$
$TiCN(MT)-TiCN(HT)-TiZrAl_2O_3-TiN/TiCN$
$TiCN(MT)-TiCN(HT)/TiOCN-TiZrAl_2O_3$
$TiCN(MT)-TiCN(HT)/TiOCN-TiZrAl_2O_3-TiN$
$TiCN(MT)-TiCN(HT)/TiOCN-TiZrAl_2O_3-TiN/TiCN$
$TiCN(HT)/TiOCN-TiZrAl_2O_3$
$TiCN(HT)/TiOCN-TiZrAl_2O_3-TiN$
$TiCN(HT)/TiOCN-TiZrAl_2O_3-TiN/TiCN$
$TiZrAl_2O_3$
$TiZrAl_2O_3-TiN$
$TiZrAl_2O_3-TiN/TiCN$

*MT = Medium Temperature CVD
**HT = High Temperature CVD

Coatings of cutting tools described herein can be subjected to post-coat treatments. Coatings, for example, can be blasted with various wet and/or dry particle compositions. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting, pressurized liquid blasting and steam blasting. Wet blasting, for example, is accomplished using a slurry of inorganic and/or ceramic particles, such as alumina, and water. The alumina particle slurry can be pneumatically projected at a surface of the coated cutting tool body to impinge on the surface of the coating. The alumina particles can generally range in size between about 20 µm and about 100 µm.

Blasting parameters include pressure, angle of impingement, distance to the part surface and duration. In some embodiments, angle of impingement can range from about 45 degrees to about 90 degrees, i.e., the particles impinge the coating surface at an angle ranging from about 45 degrees to about 90 degrees. Suitable pressures can range from 30-55 pounds per square inch (psi) at a distance to the coated surface of 1-6 inches. Further, duration of the blasting can generally range from 1-10 seconds or longer. Blasting can be generally administered over the surface area of the coating or can be applied to select locations such as in a workpiece contact area of the cutting tool. A workpiece contact area can be a honed region of the cutting tool.

In other embodiments, a coating is subjected to a polishing post-coat treatment. Polishing can be administered with paste of appropriate diamond or ceramic grit size. Grit size of the paste, in some embodiments, ranges from 1 µm to 10 µm. In one embodiment, a 5-10 µm diamond grit paste is used to polish the coating. Further, grit paste can be applied to the CVD coating by any apparatus not inconsistent with the objectives of the present invention, such as brushes. In one embodiment, for example, a flat brush is used to apply grit paste to the CVD coating in a workpiece contact area of the cutting tool.

A coating described herein can be blasted or polished for a time period sufficient to achieve a desired surface roughness ($R_a$) and/or other parameters such as reducing residual tensile stress in the coating. In some embodiments, a coating subjected to post-coat treatment has a surface roughness ($R_a$) selected from Table V.

TABLE V

| Post-Coat Surface Roughness ($R_a$) Polished Coating Surface Roughness ($R_a$)—nm |
|---|
| ≤500 |
| ≤250 |
| <200 |
| 10-250 |
| 50-175 |
| 25-150 |

Coating surface roughness can be determined by optical profilometry using WYKO® NT-Series Optical Profilers commercially available from Veeco Instruments, Inc. of Plainview, N.Y.

Further, a post-coat treatment, in some embodiments, does not remove one or more outer layers of the coating. In some embodiments, for example, a post-coat treatment does not remove an outer layer of TiN and/or TiCN. Alternatively, a post-coat treatment can remove or partially remove one or more outer layers, such as TiN and/or TiCN.

Additionally, a coating described herein can demonstrate a critical load ($L_c$) up to about 90 N. $L_c$ values for coatings described herein are determined according to ASTM C1624-05—Standard Test for Adhesion Strength by Quantitative Single Point Scratch Testing wherein a progressive loading of 10 N was used. In some embodiments, a coating described herein can exhibit an $L_c$ of 60 to 90 N or 70 to 80 N.

II. Methods of Making Coated Cutting Tools

Methods of making coated cutting tools are also provided. A method of making a coated cutting tool described herein comprises providing a cutting tool substrate and depositing over a surface of the cutting tool substrate by CVD a coating comprising a polycrystalline layer of $TiZrAl_2O_3$.

Turning now to specific steps, a method described herein comprises providing a substrate. A substrate can comprise any substrate recited in Section I hereinabove. In some embodiments, for example, a substrate is cemented carbide, such as cemented tungsten carbide, or PcBN as described in Section I. Moreover, a polycrystalline $TiZrAl_2O_3$ layer deposited according to a method described herein can demonstrate any intra-layer compositional gradient described above. For example, the CVD deposited $TiZrAl_2O_3$ layer can have an intra-layer compositional gradient including a stage composed of $Al_2O_3$ and stage composed of $TiZrAl_2O_3$. In another embodiment, the CVD deposited $TiZrAl_2O_3$ layer can display a compositional gradient including a stage composed of $Al_2O_3$, a stage composed of $ZrAl_2O_3$ and a stage composed of $TiAl_2O_3$. Such compositional gradients can also be reflected within individual grains of the $TiZrAl_2O_3$ layer.

In a method described herein, a polycrystalline $TiZrAl_2O_3$ layer can be deposited from a gas mixture comprising an aluminum source, oxygen source, titanium source and zirconium source. In some embodiments, a polycrystalline $TiZrAl_2O_3$ layer is deposited from a gas mixture comprising $AlCl_3$, $ZrCl_4$, $TiCl_4$, $H_2$ and $CO_2$. The gas mixture may also optionally comprise $H_2S$ and/or HCl. General CVD deposition parameters for a polycrystalline $TiZrAl_2O_3$ layer of a coating described herein are provided in Table VI.

TABLE VI

CVD Parameters for $TiZrAl_2O_3$ layer deposition

| Gas Mixture | Temperature (° C.) | Pressure (torr) | Duration (minutes) |
|---|---|---|---|
| $H_2$, $AlCl_3$, $ZrCl_4$, $TiCl_4$, $CO_2$, $H_2S^*$, HCl* | 800-1500 | 30-100 | 10-600 |

*Optional

Inclusion of titanium and zirconium sources simultaneously in the gas mixture, in some embodiments, provides a polycrystalline $TiZrAl_2O_3$ layer demonstrating an intra-layer compositional gradient including a stage composed of $Al_2O_3$ and a stage composed of $TiZrAl_2O_3$. As described in Section I herein, the $Al_2O_3$ stage and the $TiZrAl_2O_3$ stage can alternate throughout the polycrystalline layer.

In other embodiments, zirconium and titanium sources can be selectively introduced in the gas mixture in an alternating manner. A zirconium source, for example, can be present in the gas mixture for a predetermined time period followed by replacement with a titanium source in the gas mixture or vice-versa. In some embodiments, alternate introduction of zirconium and titanium into the gas mixture is repeated several times throughout the duration of the CVD deposition process. In other embodiments, alternate introduction of zirconium and titanium sources occurs only once in the CVD deposition process. Alternate introduction of titanium and zirconium sources in the gas mixture can produce an intra-layer compositional gradient including a stage composed of $Al_2O_3$, a stage composed of $ZrAl_2O_3$ and a stage composed of $TiAl_2O_3$. In some embodiments, alternate introduction of titanium and zirconium sources in the gas mixture can precede or follow simultaneous introduction of the titanium and zirconium sources to provide an intra-layer compositional gradient including $Al_2O_3$ stage, a $ZrAl_2O_3$ stage, a $TiAl_2O_3$ stage and a $TiZrAl_2O_3$ stage.

A polycrystalline $TiZrAl_2O_3$ layer can be deposited directly on a surface of the cutting tool substrate without use of bonding and/or modification layers. However, in some embodiments, one or more base layers of the coating reside between the substrate and the polycrystalline $TiZrAl_2O_3$ layer. A base layer can comprise one or more metallic elements selected from the group consisting of aluminum and metallic elements of Groups IVB, VB and VIB of the Periodic Table and one or more non-metallic elements of Groups IIIA, IVA, VA and VIA of the Periodic Table. A base layer, for example, can be selected from the group consisting of titanium nitride (TiN), titanium carbonitride (TiCN) and titanium oxycarbonitride (TiOCN). In some embodiments, a multilayer arrangement is present comprising TiN, TiCN and/or TiOCN. General CVD deposition parameters for various base layers are provided in Table VII.

TABLE VII

CVD Parameters for base layer deposition

| Base Layer Composition | Gas Mixture | Temperature (° C.) | Pressure (torr) | Duration (minutes) |
|---|---|---|---|---|
| TiN | $H_2$, $N_2$, $TiCl_4$ | 800-900 | 60-300 | 20-60 |
| TiCN(MT) | $H_2$, $N_2$, $TiCl_4$, $CH_3CN$ | 750-900 | 30-120 | 60-300 |
| TiCN(HT) | $H_2$, $N_2$, $TiCl_4$, $CH_4$ | 900-1050 | 30-300 | 30-100 |
| TiOCN | $H_2$, $N_2$, $TiCl_4$, $CH_4$, CO | 900-1050 | 60-500 | 30-100 |

Additionally, methods described herein can further comprise depositing one or more outer layers over the polycrystalline $TiZrAl_2O_3$ layer. An outer layer, in some embodiments, comprises one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In one embodiment, for example, an outer layer of TiN and/or TiCN is deposited with reference to CVD parameters set forth in Table VII. Coatings deposited according to methods described herein can have an architecture provided in Table IV above.

Further, the deposited coatings can be subjected to post-coat treatment(s) such as post-coat blasting or polishing as described in Section I hereinabove. Post coat blasting, in some embodiments, can change moderate tensile stress of the coating to moderate compressive stress or increase compressive stress in the as-deposited coating.

These and other embodiments are further illustrated in the following non-limiting examples.

EXAMPLE 1

Coated Cutting Tool

A coated cutting tool described herein was produced by placing a cemented tungsten carbide (WC-Co) cutting insert substrate [ANSI standard geometry CNMG432RN] into an axial flow hot-wall CVD reactor. The cutting insert comprised about 6 wt. % cobalt binder with the balance WC grains of size 1 to 5 μm. A coating having an architecture provided in Table VIII was deposited on the cemented WC cutting insert according to the CVD process parameters provided in Tables VI and VII. $TiCl_4$ and $ZrCl_4$ were simultaneously present in the CVD gas mixture to provide a polycrystalline $TiZrAl_2O_3$ layer having an intra-layer compositional gradient of $Al_2O_3$ stages alternating with $TiZrAl_2O_3$ stages.

TABLE VIII

CVD Coating Architecture

| Substrate | CVD Coating Architecture |
|---|---|
| WC-Co | TiN*-TiCN(MT)-TiCN(HT)/TiOCN-$TiZrAl_2O_3$-TiN/TiCN |

*Innermost layer adjacent to the substrate

The resulting multilayered coating comprising the polycrystalline $TiZrAl_2O_3$ layer was subjected to a post-coat treatment of wet blasting with alumina slurry and demonstrated the properties provided in Table IX.

TABLE IX

Properties of CVD Coating

| Coating Layers | Thickness (μm) |
|---|---|
| TiN | 0.3-0.7 |
| TiCN(MT) | 8.5-9 |
| TiCN(HT)/TiOCN | 0.8-1.2 |
| $TiZrAl_2O_3$ | 6.8-7.2 |
| TiN/TiCN | 1.3-1.7 |

Figure 6:
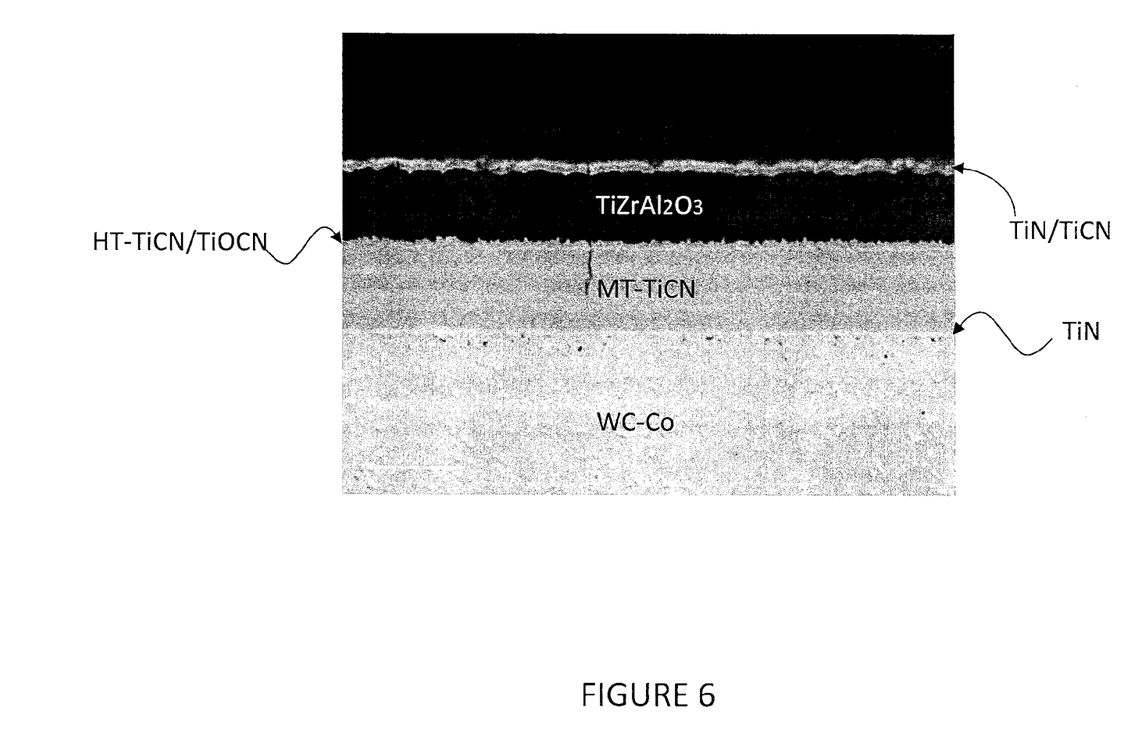
FIG. 6 is a cross-sectional optical image of a coated cutting insert according to one embodiment described herein.

FIG. 6 is a cross-sectional optical image of the coated cutting insert of this Example 1 demonstrating layers of the coating architecture.

EXAMPLE 2

Metal Cutting Testing

Coated cutting inserts (1-2) of Example 1 and Comparative coating inserts (3-6) were subjected to continuous turning testing of 1045 steel according to the parameters below. Comparative cutting inserts (3-6) displayed coating architectures and properties set forth in Tables X and XI. Comparative cutting inserts (3-6) employed a WC-Co substrate of substantially similar composition as Example 1 and an ANSI standard geometry CNMG432RN.

TABLE X

Comparative cutting inserts 3 and 4

| Coating Layers | Thickness (μm) |
|---|---|
| TiN* | 0.5-0.9 |
| TiCN(MT) | 8.5-9 |
| TiCN(HT)/TiOCN | 0.8-1.2 |
| $ZrAl_2O_3$ | 7.9-8.3 |
| TiN/TiCN | 0.6-1.0 |

*Coating Layer adjacent to WC-Co Substrate

TABLE XI

Comparative cutting inserts 5 and 6

| Coating Layers | Thickness (μm) |
|---|---|
| TiN* | 0.3-0.7 |
| TiCN(MT) | 7.8-8.2 |
| TiCN(HT)/TiOCN | 0.8-1.2 |
| α-Al$_2$O$_3$ | 6.8-7.2 |
| TiN/TiCN | 1.3-1.7 |

*Coating Layer adjacent to WC-Co Substrate

Further, coated cutting inserts (1-2) of Example 1 and Comparative coated inserts (3-6) were post-coat treated according to Table XII.

TABLE XII

Post-coat treatment

| Cutting Insert | Post-coat treatment |
|---|---|
| 1 | Polish—5-10 μm diamond grit paste |
| 2 | Wet Blast—alumina particle slurry |
| 3 | Polish—5-10 μm diamond grit paste |
| 4 | Wet Blast—alumina particle slurry |
| 5 | None |
| 6 | None |

Coated cutting inserts (1-2) of Example 1 and Comparative coating inserts (3-6) were subjected to continuous turning testing as follows:
Workpiece—1045 Steel
Speed—1000 sfm (304.8 m/min)
Feed Rate—0.012 ipr (0.3048 mm/min)
Depth of Cut—0.08 inch (0.08 mm)
Lead Angle: −5°
End of Life was registered by one or more failure modes of:
Uniform Wear (UW) of 0.012 inches
Max Wear (MW) of 0.012 inches
Nose Wear (NW) of 0.012 inches
Depth of Cut Notch Wear (DOCN) 0f 0.012 inches
Trailing Edge Wear (TW) of 0.012 inches
Two cutting inserts were tested for each coating architecture (1-6) providing repetition 1 and 2 data as well as mean cutting lifetime. The results of the continuous turning testing are provided in Table XIII.

TABLE XIII

Continuous Turning Testing Results

| Cutting Insert | Repetition 1 Lifetime (minutes) | Repetition 2 Lifetime (minutes) | Mean Cutting Lifetime (minutes) |
|---|---|---|---|
| 1 | 16.1 | 25 | 20.6 |
| 2 | 27.2 | 29.4 | 28.3 |
| 3 | 17.9 | 18.8 | 18.3 |
| 4 | 23.0 | 23.6 | 23.3 |
| 5 | 26.6 | 28.4 | 27.5 |
| 6 | 23.9 | 18.2 | 21.1 |

As provided in Table XIII, coated cutting tool 2 having the architecture of Example 1 demonstrated the best mean cutting lifetime. Further, coated cutting tools 1 and 2 having the architecture of Example 1 displayed enhanced resistance to micro-chipping, notably on the rake face, which contributed to longer tool lifetime.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A coated cutting tool comprising:
a substrate; and
a coating adhered to the substrate, the coating comprising a polycrystalline layer of TiZrAl$_2$O$_3$ having an intra-layer compositional gradient formed by Al$_2$O$_3$ regions and TiZrAl$_2$O$_3$ regions.

2. The coated cutting tool of claim 1, wherein the Al$_2$O$_3$ regions and TiZrAl$_2$O$_3$ regions alternate throughout the polycrystalline layer.

3. The coated cutting tool of claim 1, wherein an individual grain of the polycrystalline TiZrAl$_2$O$_3$ layer displays the intra-layer compositional gradient including the Al$_2$O$_3$ regions and TiZrAl$_2$O$_3$ regions.

4. The coated cutting tool of claim 1, wherein at least one TiZrAl$_2$O$_3$ region displays a compositional gradient formed by localization of titanium or zirconium in one or more portions of the TiZrAl$_2$O$_3$ region.

5. The coated cutting tool of claim 4, wherein zirconium is localized in a portion of the TiZrAl$_2$O$_3$ region adjacent one or more grain boundaries.

6. The coated cutting tool of claim 1, wherein titanium and zirconium are each present in the polycrystalline TiZrAl$_2$O$_3$ layer in an amount of 0.01-5 wt. %.

7. The coated cutting tool of claim 1, wherein the coating further comprises one or more base layers between the substrate and the polycrystalline layer of TiZrAl$_2$O$_3$.

8. The coated cutting tool of claim 7, wherein a base layer comprises one or more metallic elements selected from the group consisting of aluminum and metallic elements of Groups IVB, VB and VIB of the Periodic Table and one or more non-metallic elements of Groups IIIA, IVA, VA and VIA of the Periodic Table.

9. The coated cutting tool of claim 7, wherein the one or more base layers are selected from the group consisting of TiN, TiCN and TiOCN.

10. The coated cutting tool of claim 1, wherein the coating further comprises one or more outer layers over the polycrystalline TiZrAl$_2$O$_3$ layer.

11. The coated cutting tool of claim 10, wherein an outer layer comprises one or more metallic elements selected from the group consisting of aluminum and metallic elements of Groups IVB, VB and VIB of the Periodic Table and one or more non-metallic elements of Groups IIIA, IVA, VA and VIA of the Periodic Table.

12. The coated cutting tool of claim 10, wherein the coating is post-coat blasted with ceramic or inorganic particles.

13. The coated cutting tool of claim 10, wherein the coating is polished.

14. The coated cutting tool of claim 1, wherein the polycrystalline TiZrAl$_2$O$_3$ layer is deposited by CVD.

15. The coated cutting tool of claim 1, wherein the substrate comprises cemented tungsten carbide or polycrystalline cubic boron nitride.

16. The coated cutting tool of claim 1, wherein the coating exhibits a critical load ($L_c$) of 60 to 90 N according to ASTM C1624-05—Standard Test for Adhesion by Quantitative Single Point Scratch Testing.

17. A coated cutting tool comprising:
a substrate; and
a coating adhered to the substrate, the coating comprising a polycrystalline layer of TiZrAl$_2$O$_3$ having an intra-layer compositional gradient formed by $Al_2O_3$ regions, $ZrAl_2O_3$ regions and $TiAl_2O_3$ regions.

18. The coated cutting tool of claim 17, wherein the $Al_2O_3$ regions, $ZrAl_2O_3$ regions and $TiAl_2O_3$ regions alternate throughout the polycrystalline layer.

19. The coated cutting tool of claim 17, wherein an individual grain of the polycrystalline $TiZrAl_2O_3$ layer displays the intra-layer compositional gradient including the $Al_2O_3$ regions, $ZrAl_2O_3$ regions and $TiAl_2O_3$ regions.

20. The coated cutting tool of claim 17, wherein the polycrystalline $TiZrAl_2O_3$ layer is deposited by CVD.

21. The coated cutting tool of claim 17, wherein the substrate comprises cemented tungsten carbide.

22. The coated cutting tool of claim 17, wherein the substrate comprises polycrystalline cubic boron nitride.

23. The coated cutting tool of claim 17, wherein the coating exhibits a critical load ($L_c$) of 60 to 90 N according to ASTM C1624-05—Standard Test for Adhesion by Quantitative Single Point Scratch Testing.

* * * * *